United States Patent
Steinbeiser et al.

(10) Patent No.: US 9,936,587 B2
(45) Date of Patent: Apr. 3, 2018

(54) METHOD OF FABRICATING A MULTI-CHANNEL MODULATOR DRIVER WITH ENCLOSURE

(71) Applicant: TRIQUINT SEMICONDUCTOR, INC., Hillsboro, OR (US)

(72) Inventors: Craig Steinbeiser, Allen, TX (US); Khiem Dinh, Plano, TX (US); Anthony Chiu, Richardson, TX (US)

(73) Assignee: Qorvo US, Inc., Greensboro, NC (US)

( * ) Notice: Subject to any disclaimer, the term of this patent is extended or adjusted under 35 U.S.C. 154(b) by 233 days.

(21) Appl. No.: 14/810,681

(22) Filed: Jul. 28, 2015

(65) Prior Publication Data

US 2015/0334848 A1 Nov. 19, 2015

Related U.S. Application Data

(62) Division of application No. 13/309,424, filed on Dec. 1, 2011, now Pat. No. 9,113,549.

(51) Int. Cl.
*H05K 9/00* (2006.01)
*H05K 3/30* (2006.01)

(52) U.S. Cl.
CPC .......... *H05K 3/305* (2013.01); *H05K 9/003* (2013.01); *H05K 9/0037* (2013.01);
(Continued)

(58) Field of Classification Search
CPC .. H05K 2203/043; H05K 3/305; H05K 9/003; H05K 9/0037; Y10T 29/49016; Y10T 29/49018; Y10T 29/4902
See application file for complete search history.

(56) References Cited

U.S. PATENT DOCUMENTS

| 4,861,941 A | 8/1989 | Kubo et al. |
| 5,337,396 A | 8/1994 | Chen et al. |

(Continued)

FOREIGN PATENT DOCUMENTS

| JP | H098487 A | 1/1997 |
| JP | 2003174278 A | 6/2003 |

(Continued)

OTHER PUBLICATIONS

Author Unknown, "2811dz: 28 Gbps Differential Mach-Zehnder Driver in 7X7mm Ceramic LGA Package," Inphi Corporation, retrieved Apr. 5, 2011, from http://www.inphi.com/products/2811dz.php, 2 pages.

(Continued)

*Primary Examiner* — Minh Trinh
(74) *Attorney, Agent, or Firm* — Withrow & Terranova, P.L.L.C.

(57) ABSTRACT

Embodiments of the present disclosure describe a method of fabricating a multi-channel modulator driver with an enclosure. After a substrate is provided, components of a multi-channel modulator driver are attached to the substrate. Herein, the components include first components associated with a first channel and second components associated with a second channel. Next, an enclosure is attached to the substrate to cover the multi-channel modulator driver. The enclosure has a wall disposed between the first components and the second components, and a top region coupled with the wall. The enclosure and the wall are composed of an electrically conductive polymer. The wall includes a first portion that has the electrically conductive polymer covered by a metal film and a second portion that has the electrically conductive polymer not covered by the metal film.

4 Claims, 6 Drawing Sheets

(52) U.S. Cl.
CPC ..... *H05K 2203/043* (2013.01); *Y10T 29/4902* (2015.01); *Y10T 29/49016* (2015.01); *Y10T 29/49018* (2015.01)

(56) References Cited

U.S. PATENT DOCUMENTS

| | | | |
|---|---|---|---|
| 6,037,846 A * | 3/2000 | Oberhammer | H01R 13/7195 174/367 |
| 6,958,445 B1 * | 10/2005 | Boudreaux | H05K 1/0218 174/359 |
| 7,326,862 B2 | 2/2008 | Lionetta et al. | |
| 7,599,667 B2 | 10/2009 | Arai | |
| 8,125,788 B2 | 2/2012 | Hatanaka et al. | |
| 8,629,355 B2 | 1/2014 | Kwon et al. | |
| 8,815,614 B2 * | 8/2014 | Rodgers | H01L 23/642 327/551 |
| 9,113,549 B2 | 8/2015 | Steinbeiser et al. | |
| 2009/0091904 A1 * | 4/2009 | Hatanaka | H03H 9/1021 361/764 |
| 2011/0051375 A1 | 3/2011 | Ammar | |
| 2015/0334848 A1 * | 11/2015 | Steinbeiser | H05K 9/003 29/601 |

FOREIGN PATENT DOCUMENTS

| | | |
|---|---|---|
| JP | 2005136272 A | 5/2005 |
| JP | 2005317935 A | 11/2005 |
| JP | 2006041037 A | 2/2006 |

OTHER PUBLICATIONS

Author Unknown, "A thermoplastic composite for cost-effective EMI shielding," SABIC Innovative Plastics, 2007, 24 pages.
Author Unknown, "GX6255-C 32Gb/s MZ Modulator Driver," GigOptix, Inc., 2011, 1 page.
Author Unknown, "OA3MHDL Preliminary Datasheet: Dual Input 28Gb/s Broadband 7.5V Lithium Niobate Modulator Driver Amplifier," Centellax, Inc., Oct. 22, 2010, 8 pages.
Author Unknown, "OA3MHP Preliminary Datasheet: 40G DQPSK/100G DP-QPSK 8 V LiNbO3 Driver Surface Mount Ceramic Package," Centellax, Inc., Dec. 2, 2010, 4 pages.
Author Unknown, "OA3MHQM Preliminary Datasheet: Quad Input 28Gb/s Broadband 8 V Lithium Niobate Modulator Driver Amplifier," Centellax, Inc., Nov. 15, 2010, 5 pages.
Author Unknown, "VWA 00090 AA Data Sheet," VectraWave, VWA00090 AAxx DS Rev 0.32, Mar. 2010, 8 pages.
Non-Final Office Action for U.S. Appl. No. 13/309,424, dated Apr. 4, 2014, 14 pages.
Final Office Action for U.S. Appl. No. 13/309,424, dated Nov. 28, 2014, 13 pages.
Notice of Allowance for U.S. Appl. No. 13/309,424, dated Apr. 13, 2015, 7 pages.
Notification of Reason(s) for Refusal for Japanese Patent Application No. 2012-260648, dated Sep. 6, 2016, 11 pages.
Patent Assessment for Japanese Patent Application No. 2012-260648, dated Apr. 4, 2017, 6 pages.

\* cited by examiner ic
METHOD OF FABRICATING A MULTI-CHANNEL MODULATOR DRIVER WITH ENCLOSURE This application is a Divisional of U.S. patent application Ser. No. 13/309,424, filed Dec. 1, 2011, now U.S. Pat. No. 9,113,549, the disclosure of which is incorporated herein by reference in its entirety.

FIELD

Embodiments of the present disclosure generally relate to the field of radio-frequency (RF) emitting integrated circuits, and more particularly, to an enclosure for a multi-channel driver such as a multichannel modulator driver.

BACKGROUND

The development of transponder technology is rapidly accelerating to meet high data rate needs of next-generation optical carrier networks. Emerging transponders may, for example, use multi-level Dual Polarization Quadrature Phase Shift Keying (DP-QPSK) modulation schemes to improve optical spectral efficiency. The emerging transponders may include multiple radio frequency data input ports that utilize multi-channel modulator drivers. The multi-channel modulator drivers may be positioned such that radio-frequency (RF) emitting components associated with different channels interfere with one another (e.g., cross-channel coupling). Techniques and configurations to isolate the channels and reduce such interference may be desirable.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure describe techniques and configurations for an enclosure that can be used for a multi-channel modulator driver such as, for example, an optical modulator driver. In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous. The term "coupled" may refer to a direct connection, an indirect connection, or an indirect communication.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The description may use perspective-based descriptions such as over/under, or top/bottom. Such descriptions are merely used to facilitate the discussion and are not intended to restrict the application of embodiments described herein to any particular orientation.

Figure 1:
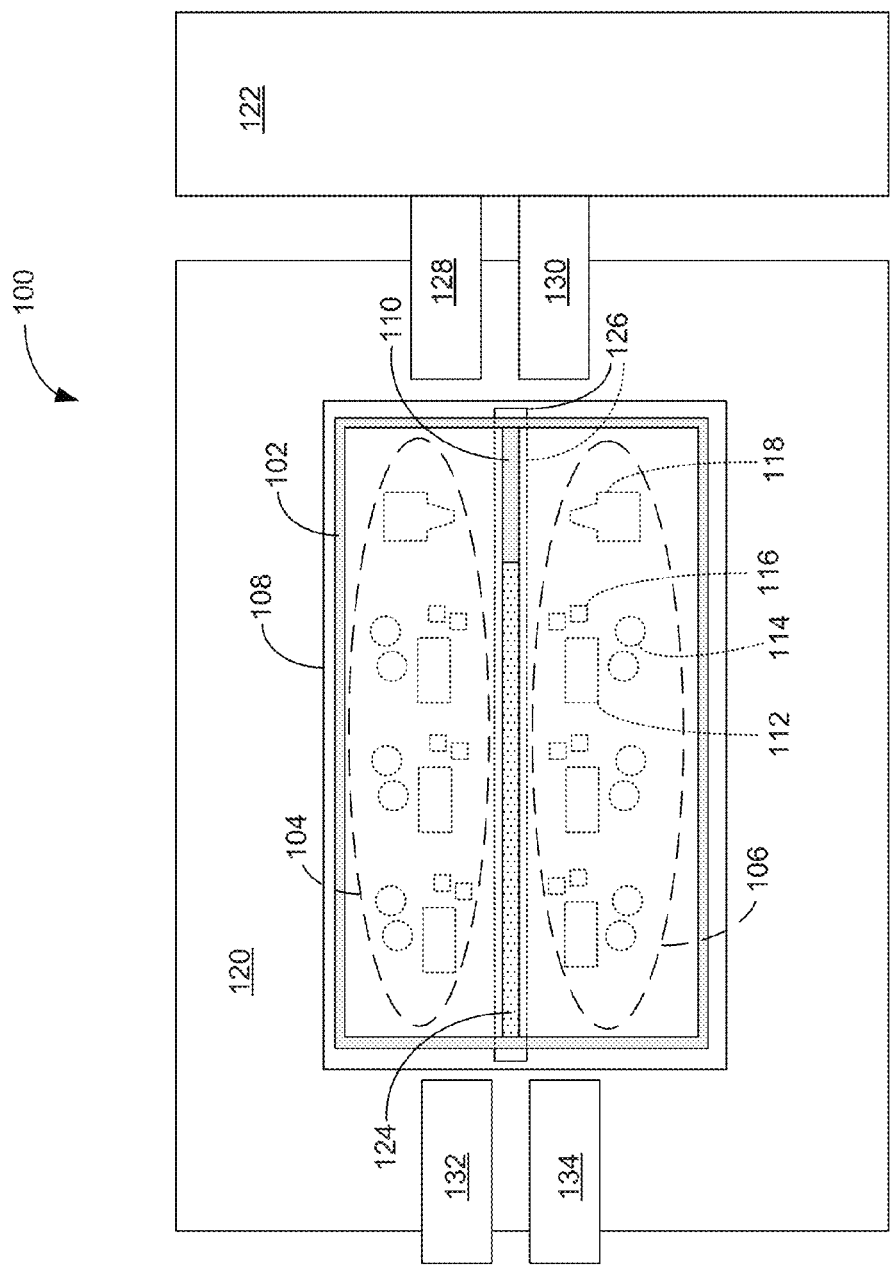
FIG. 1 schematically illustrates a top view of a system including an enclosure for a multi-channel modulator driver, according to various embodiments.

FIG. 1 schematically illustrates a top view of a system 100 including an enclosure 102 for a multi-channel modulator driver, according to various embodiments. The enclosure 102 is configured to cover components 104 of a first channel of the multi-channel modulator driver and components 106 of a second channel of the multi-channel modulator driver that are coupled to a substrate 108, which may be referred to as a package substrate. The components 104, 106 are depicted in dashed form to indicate that they underlie a top region (e.g., Top Region of FIG. 3) of the enclosure 102, which is not shown in FIG. 1 for the sake of clarity. The first channel may be an "I" channel and the second channel may be a "Q" channel as commonly used in the field of optical drivers, in some embodiments.

The components 104, 106 may include components that, when in operation, emit radio frequency (RF) energy. For example, the components 104, 106 may include one or more amplifiers such as, for example, one or more distributed amplifiers 112. In some embodiments, the components 104, 106 each include three distributed amplifiers (e.g., broadband distributed amplifiers), as depicted. The three distributed amplifiers of each of the corresponding components 104, 106 may each correspond with a stage of an amplifying cascade and may include one or more microwave integrated circuits (MICs) in some embodiments. In some embodiments, each stage of the amplifying cascade may have an inductor. In some embodiments, the components 104, 106 may include components for one or two stages or greater than three stages.

The components 104, 106 may further include one or more capacitors such as, for example, one or more bypass capacitors 114 and/or one or more Direct Current (DC) blocking capacitors 116. In some embodiments, the components 104, 106 include two bypass capacitors and two DC blocking capacitors per amplifier.

The components 104, 106 may further include one or more inductors 118. In one embodiment, the components 104, 106 each include one inductor. The one or more inductors 118 may be packaged external to the enclosure 102 in some embodiments. The components 104, 106 may include additional features such as, for example, routing features (not shown) such as traces or wirebond structures that facilitate electrical connections between the components 104, 106, the substrate 108, and other devices (e.g., printed circuit board 120, modulator 122). More or less components 104, 106 than depicted can be used in other embodiments.

The enclosure 102 may be coupled to the substrate 108 using an adhesive. In some embodiments, a peripheral region (e.g., Peripheral Region of FIG. 3) of the enclosure 102 is attached to the substrate 108 using an electrically insulative adhesive such as an epoxy. According to various embodiments, a combination of electrically conductive and non-conductive adhesive may be used to obtain a desired level of performance and cross-channel isolation.

In an embodiment, the enclosure 102 includes at least one wall (hereinafter "wall 110") configured to isolate the components 104 of the first channel from the components 106 of the second channel. The wall 110 may extend from the top region of the enclosure 102 to the substrate 108 and may be disposed between components 104 of the first channel and components 106 of the second channel. The wall 110 may be attached to the substrate 108 using an adhesive. The first and second channels may be separated by a distance of approximately 2.5 millimeters (mm) in some embodiments. The first and second channels may be separated by greater or shorter distances in other embodiments.

Figure 2:
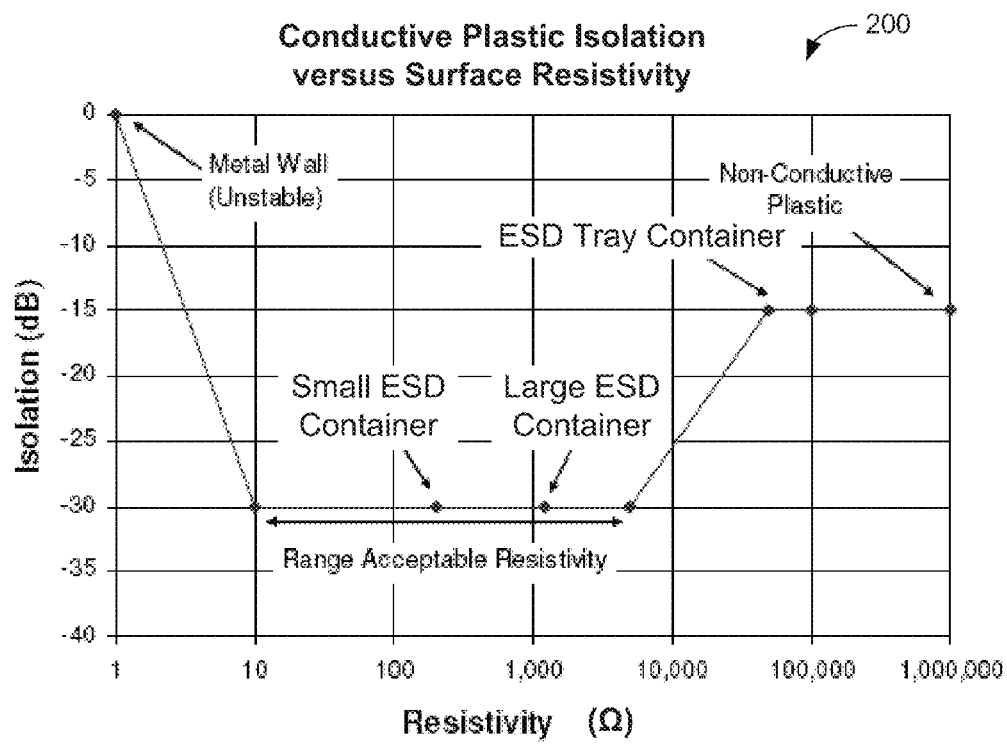
FIG. 2 is a graph of Isolation versus Resistivity for various materials, according to various embodiments.

In various embodiments, the enclosure 102 and the wall 110 are composed of an electrically conductive polymer. The electrically conductive polymer may be selected for fabrication of the enclosure 102 based on a surface resistivity (e.g., per test method of the International Electrotechnical Commission (IEC) 93) of the polymer that provides adequate isolation between adjacent channels of a multi-channel modulator driver. For example, referring briefly to FIG. 2, a graph 200 depicts Isolation (dB) versus Surface Resistivity (Ohms) for various materials, according to various embodiments. As can be seen, a range (e.g., Range Acceptable Resistivity) from about 10 Ohms to about 5000 Ohms of surface resistivity may be capable of providing about −30 decibel (dB) of broadband isolation between adjacent channels of a multi-channel modulator driver. According to various embodiments, the enclosure 102 and wall 110 described herein may provide −30 dB cross-channel isolation across a wide frequency band extending from 0 Hertz (Hz) or DC to at least 50 GHz.

Returning again to FIG. 1, the electrically conductive polymer of the enclosure 102 and wall 110 may be formed by blending a variety of conductive materials into a base polymer material. For example, electrically conductive fillers such as carbon fiber, carbon black, steel fiber, nickel fiber, other metal fiber or particles, or combinations thereof, may be added to a polymer to increase electrical conductivity. Other suitable electrically conductive fillers can be used in other embodiments. In some embodiments, the electrically conductive polymer may have a surface resistivity ranging from 10 Ohms to 5000 Ohms or in some embodiments 200 Ohms to 1200 Ohms.

In some embodiments, the enclosure 102 may resist softening at a temperature of at least 260° C., which may be a temperature condition associated with a solder reflow process that may be used to attach the substrate 108 or other components to the printed circuit board 120. The enclosure 102 may resist softening at temperatures up to approximately 260° C. In some embodiments, the enclosure 102 may be composed of a conductive filler (e.g., 30% by weight) such as carbon fiber or carbon black and at least one of liquid crystal polymer (LCP) or polyether ether ketone (PEEK). The electrically conductive polymer may be suitable for use with an injection molding process that may be used to fabricate the enclosure 102. An enclosure 102 composed of an electrically conductive polymer may eliminate or reduce a need for application of an additional absorber material to provide channel isolation.

In some embodiments, the wall 110 may further include a film 124 composed of an electrically conductive material such as, for example, metal disposed on at least a portion of the wall 110 up to and including an entire surface of the wall 110 (e.g., from a surface of the wall 110 that adjoins the top region of the enclosure 102 to a surface of the wall 110 that is coupled to the substrate 108). The film 124 may further increase isolation between the first channel and second channel relative to a similarly configured all metal wall, which may exhibit degraded channel isolation relative to a wall having only the electrically conductive polymer or a wall having an electrically conductive polymer covered by the film 124. According to various embodiments, the film 124 includes a metal such as, for example, aluminum, silver, gold, nickel, or copper having a thickness ranging from a single atomic layer to 40 mils (1 mil=a thousandth of an inch). The film 124 may be composed of other metals or other suitable electrically conductive materials and/or may have other thicknesses in other embodiments.

In some embodiments, the wall 110 is only partially covered with the film 124. For example, the film 124 may be disposed to only cover the portion of the wall 110 that is directly between components (e.g., one or more distributed amplifiers 112) of the first channel and the second channel that emit RF energy. In the depicted embodiment, a region of the wall 110 (e.g., between the one or more inductors 118 of the first and second channels) that is not directly between the distributed amplifiers 112 is not covered by the film 124. Thus, in some embodiments, the film 124 does not cover at least a portion of the wall 110. Partially covering the wall 110 with the film 124 may further increase channel isolation relative to a wall 110 that is completely covered with the film 124. In some embodiments, the portion of the wall 110 that is covered with the film 124 has a length (e.g., left to right in FIG. 1) of about 11 mm and the portion of the wall 110 that is not covered with the film 124 has a length of about 5 mm. In other embodiments, the one or more inductors 118 may be packaged external to the enclosure 102. In such embodiments, the wall 110 may be covered entirely with the film 124.

According to various embodiments, the substrate 108 is generally composed of an epoxy-based material and may include glass and/or ceramic filler or any other suitable material for high frequency RF applications. In one embodiment, the substrate 108 includes a ground structure such as, for example, ground strip 126. The ground strip 126 is composed of an electrically conductive material such as, for example, a metal that is electrically coupled to a ground voltage supply (not shown) such as, for example, RF ground. In the depicted embodiment, the ground strip 126 traverses a length of the substrate 108, between the components 104, 106, that corresponds with a length of the wall 110.

The wall 110 including the film 124, if used, may be electrically coupled to the ground strip 126. For example, the wall 110 may be electrically coupled to the ground strip 126 using an electrically conductive adhesive such as, for example, silver epoxy or paste to bond the film 124 and/or wall 110 with the ground strip 126. Electrically coupling the wall 110 to the ground strip may increase channel isolation relative to an enclosure 102 that is not electrically coupled to ground. The ground strip 126 may have other shapes or configurations in other embodiments. For example, the ground strip 126 may be configured to provide electrical contact for only a portion of the wall 110.

The substrate 108 may further include routing features (not shown) to route electrical signals between the multi-channel modulator driver and the printed circuit board 120. Although in the top view of FIG. 1 and top perspective view of FIG. 3, the substrate 108 extends to a position external and beyond the peripheral region (e.g., Peripheral Region of FIG. 3) of the enclosure 102, in other embodiments, the substrate 108 has a size that is coextensive with the peripheral region such that the substrate 108 does not extend beyond the peripheral region of the enclosure 102.

According to various embodiments, the substrate 108 is mounted on the printed circuit board 120. The substrate 108 may be mounted, for example, using conventional surface mount technology. The printed circuit board 120 may include input connectors 132, 134 that route signals to respective components 104, 106 of the first and second channels and output connectors 128, 130 that route signals from the respective components 104, 106 to modulator 122. The modulator 122 may be, for example, an optical modulator capable of operating at 100 Gigabytes (Gb)/second. The system 100 may include other types of modulators 122 in other embodiments.

Figure 3:
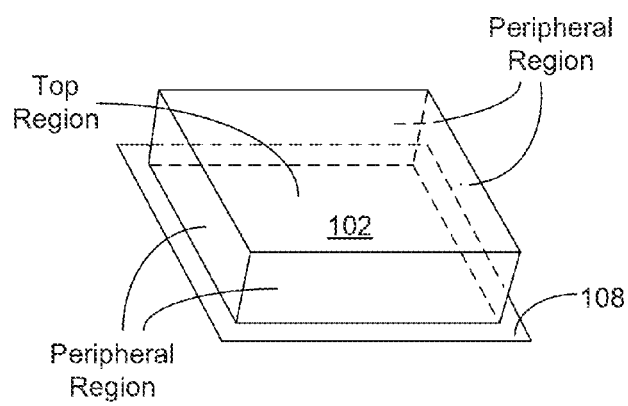
FIG. 3 schematically illustrates a top perspective view of an enclosure, according to various embodiments.

FIG. 3 schematically illustrates a top perspective view of an enclosure 102, according to various embodiments. The enclosure 102 may be mounted on a substrate 108. In some embodiments, the enclosure 102 includes a top region (e.g., Top Region) and peripheral region (e.g., Peripheral Region), as can be seen. The peripheral region may include surfaces that are coupled to the substrate using, e.g., an adhesive. The top region covers components disposed within the enclosure 102. The enclosure 102 may include other shapes (e.g., non-rectangular) in other embodiments.

Figure 4:
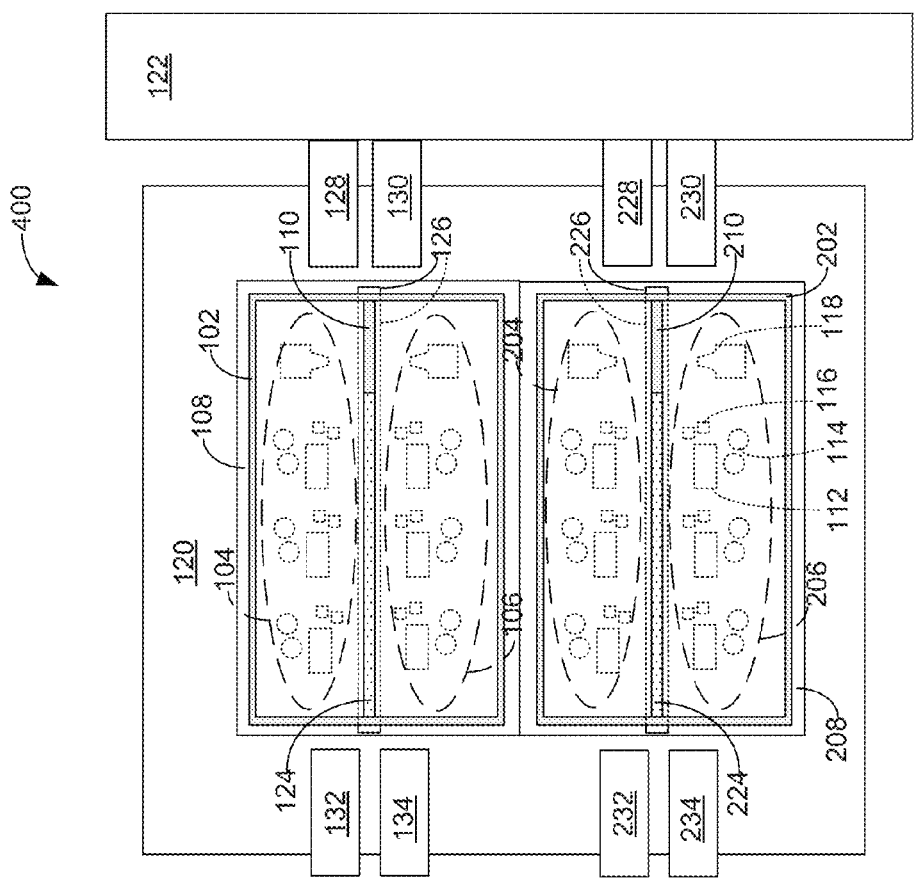
FIG. 4 schematically illustrates a top view of another system including multiple enclosures for multiple multi-channel modulator drivers, according to various embodiments.

FIG. 4 schematically illustrates a top view of another system 400 including multiple enclosures 102, 202 for multiple multi-channel modulator drivers, according to various embodiments. According to various embodiments, the system 400 includes an enclosure 102 that may be a first enclosure coupled to a substrate 108 and having a wall 110 that provides channel isolation between components 104 of a first channel of a multi-channel modulator driver and components 106 of a second channel of the multi-channel modulator. The system 400 may further include an enclosure 202 that may be a second enclosure coupled to another substrate 208 and having another wall 210 that provides channel isolation between components 204 of a first channel of another multi-channel modulator driver and components 206 of a second channel of the other multi-channel modulator driver.

Enclosure 202, components 204, 206, substrate 208, wall 210, film 224, and ground strip 226 may comport with embodiments described in connection with respective enclosure 102, components 104, 106, substrate 108, wall 110, metal film 124, and ground strip 126 of FIG. 1. Substrates 108 and 208 may be separate components mounted on the printed circuit board 120.

The printed circuit board 120 may include additional input connectors 232, 234 that route signals to the respective components 204, 206 of the first and second channels of the other multi-channel modulator driver and additional output connectors 228, 230 that route signals from respective components 204, 206 to modulator 122. According to various embodiments, the system 400 represents a quad channel system consisting of two dual channel drivers. The system 400 may be expanded to include additional channel modulator drivers in other embodiments.

Figure 5:
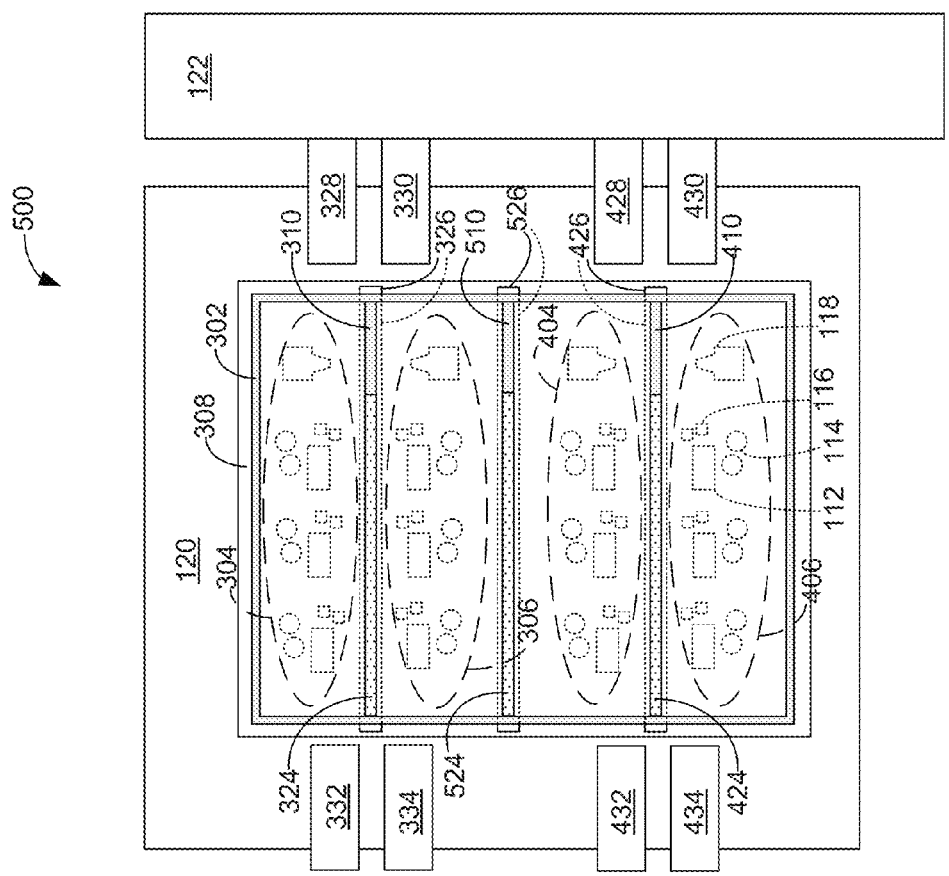
FIG. 5 schematically illustrates a top view of yet another system including a single enclosure having multiple walls for a multi-channel modulator driver, according to various embodiments.

FIG. 5 schematically illustrates a top view of yet another system 500 including a single enclosure 302 having multiple walls 310, 410, 510 for a multi-channel modulator driver, according to various embodiments. In some embodiments, components 304, 306, 404, 406 of a respective first channel, second channel, third channel, and fourth channel of a multi-channel modulator driver are mounted on a single substrate 308. The enclosure 302 may include a wall 310 to provide channel isolation between components 304 and 306 and wall 410 to provide channel isolation between components 404 and 406. The enclosure 302 may further include wall 510 to provide channel isolation between components 306 and 404.

Enclosure 302, components 304, 306, 404, 406, substrate 308, walls 310, 410, 510, metal film 324, 424, 524 and ground strips 326, 426, 526 may each comport with embodiments described in connection with respective enclosure 102, components 104, 106, substrate 108, wall 110, metal film 124, and ground strip 126 of FIG. 1. Substrate 308 may be a single component mounted on the printed circuit board 120.

The printed circuit board 120 may include input connectors 332, 334 that route signals to the respective components 304, 306 of the first and second channels of the multi-channel modulator driver and output connectors 328, 330 that route signals from the respective components 304, 306 to modulator 122. The printed circuit board 120 may further include input connectors 432, 434 that route signals to respective components 404, 406 of the third and fourth channels of the multi-channel modulator driver and output connectors 428, 430 that route signals from the respective components 404, 406 to modulator 122.

According to various embodiments, the system 500 may represent another configuration for a quad channel system consisting of two dual channel drivers. In some embodiments, the system 500 may include three or more channels of a multi-channel modulator driver. A wall (e.g., wall 310, 410, or 510) may be disposed between components (e.g., components 304, 306, 404, 406) of each channel of the multi-channel modulator. The system 500 may be expanded to include additional channel modulator drivers in other embodiments.

Figure 6:
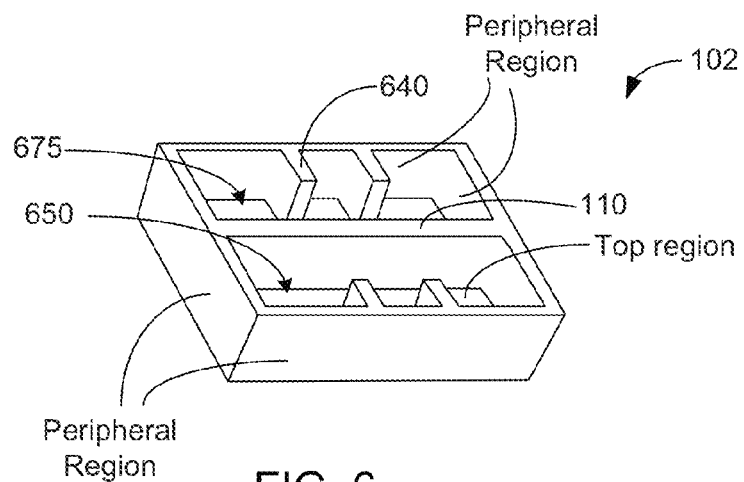
FIG. 6 schematically illustrates a bottom perspective view of an enclosure, according to various embodiments.

FIG. 6 schematically illustrates a bottom perspective view of an enclosure 102, according to various embodiments. For example, the bottom perspective view may be an opposite view of the enclosure 102 depicted in FIG. 3.

In some embodiments, the enclosure 102 may be configured for attachment to a substrate (e.g., substrate 108 of FIG. 1) to cover a multi-channel modulator driver mounted on the substrate. According to various embodiments, the enclosure 102 may include a top region, a plurality of peripheral regions coupled with the top region, and a wall 110. The wall 110 may be coupled with the top region and first and second peripheral regions of the plurality of peripheral regions, as can be seen, to form a first cavity 650 and a second cavity 675. The enclosure 102 may be configured to be coupled with a substrate with components (e.g., components 104 of FIG. 1) of a first channel of a multi-channel modulator driver disposed in the first cavity 650 and components (e.g., components 106 of FIG. 1) of a second channel of the multi-channel modulator driver disposed in the second cavity 675

The enclosure 102 may include one or more fin structures 640. In some embodiments, the one or more fin structures 640 may extend from a peripheral region (e.g., a third and/or fourth peripheral region) of the enclosure towards the wall 110, as can be seen. In some embodiments, each of the one or more fin structures 640 is configured to extend between RF-emitting components of a channel when the enclosure 102 is coupled to a substrate. For example, in some embodiments, a fin of the one or more fin structures 640 is configured to extend between each amplifier of a plurality of amplifiers of a channel (e.g., one or more distributed amplifiers 112 of FIG. 1) when the enclosure 102 is coupled to a substrate. In some embodiments, each of the one or more fin structures 640 extends between at least two amplifiers of the channel. The one or more fin structures 640 may extend from the top region and/or from the wall 110 in other embodiments.

According to some embodiments, the enclosure 102 including the wall 110 and one or more fin structures 640 are part of a single, continuous material structure. For example, the enclosure 102, the wall 110, and the one or more fin structures 640 may be simultaneously formed using an injection molding process. The one or more fin structures 640 may comprise an electrically conductive polymer that is used to fabricate the enclosure 102 in some embodiments.

Figure 7:
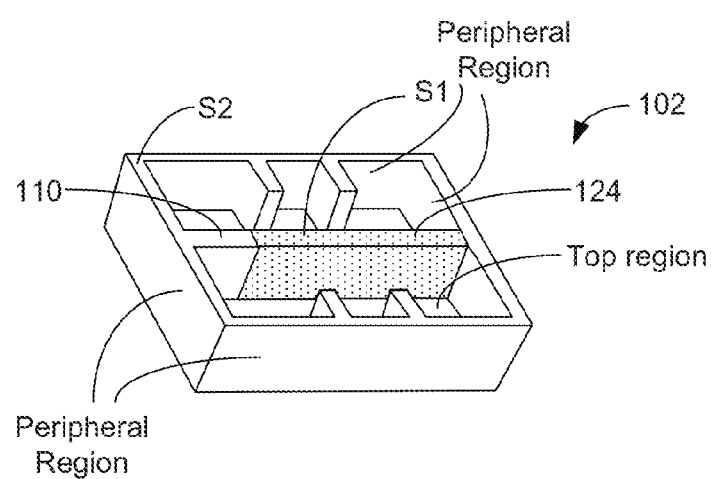
FIG. 7 schematically illustrates a bottom perspective view of the enclosure of FIG. 6 having a metal film disposed on a wall of the enclosure, according to various embodiments.

FIG. 7 schematically illustrates a bottom perspective view of the enclosure 102 of FIG. 6 having a film 124 of metal disposed on a wall 110 of the enclosure 102, according to various embodiments. As can be seen, the film 124 may be disposed on at least a portion of the wall 110. The film 124 may extend to cover a surface of the wall 110 that adjoins the top region of the enclosure 102, as can be seen, and may wrap around a surface, S1, of the wall 110 that may be coupled to the substrate using an electrically conductive adhesive. At least a portion of the surface S1 may be covered with the film 124 in some embodiments. In some embodiments, the electrically conductive adhesive may be applied to cover the entire surface S1 including portions of the surface S1 covered with the film 124 and portions of the surface S1 that are not covered with the film 124 to provide electrical contact between the surface S1 of the wall 110 and the ground strip (e.g., ground strip 126) along the entire surface S1. A surface, S2, of the peripheral region may be coupled to the substrate using an electrically insulative adhesive.

Figure 8:
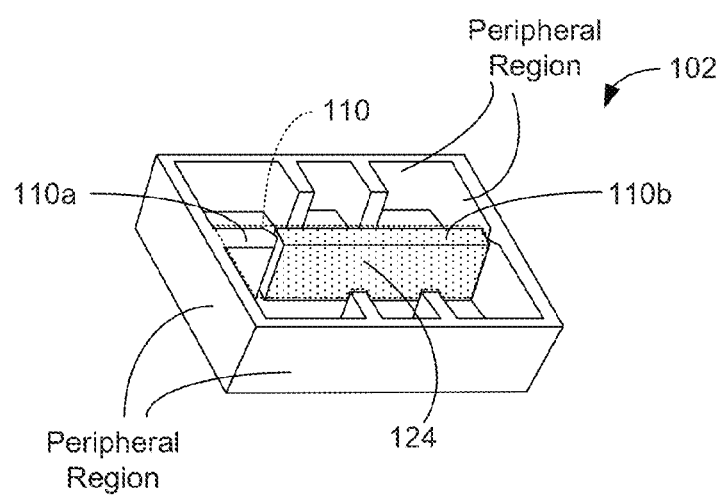
FIG. 8 schematically illustrates a bottom perspective view of an enclosure having an alternative wall configuration, according to various embodiments.

FIG. 8 schematically illustrates a bottom perspective view of an enclosure 102 having an alternative wall configuration, according to various embodiments. In FIG. 8, the wall 110 is configured to have a first portion 110a that extends to structurally support, secure, or fasten a second portion 110b that may be fabricated as a separate component and attached between the first portion 110a and a peripheral region of the enclosure 102 to complete the wall 110. In some embodiments, the second portion 110b is covered with a film 124 of metal and the first portion 110a does not have any film of metal on the surface at all. Such configuration may facilitate depositing or otherwise attaching the film 124 to the second portion 110b prior to attaching the second portion to the enclosure 102 when the second portion 110b is separate from the enclosure 102. The second portion 110b may be coupled to the enclosure 102 including, for example, the first portion 110a using any suitable technique. In some embodiments, the second portion 110b may be entirely composed of an electrically conductive material such as a metal including, for example, copper or brass. Other electrically conductive materials can be used in other embodiments.

Figure 9:
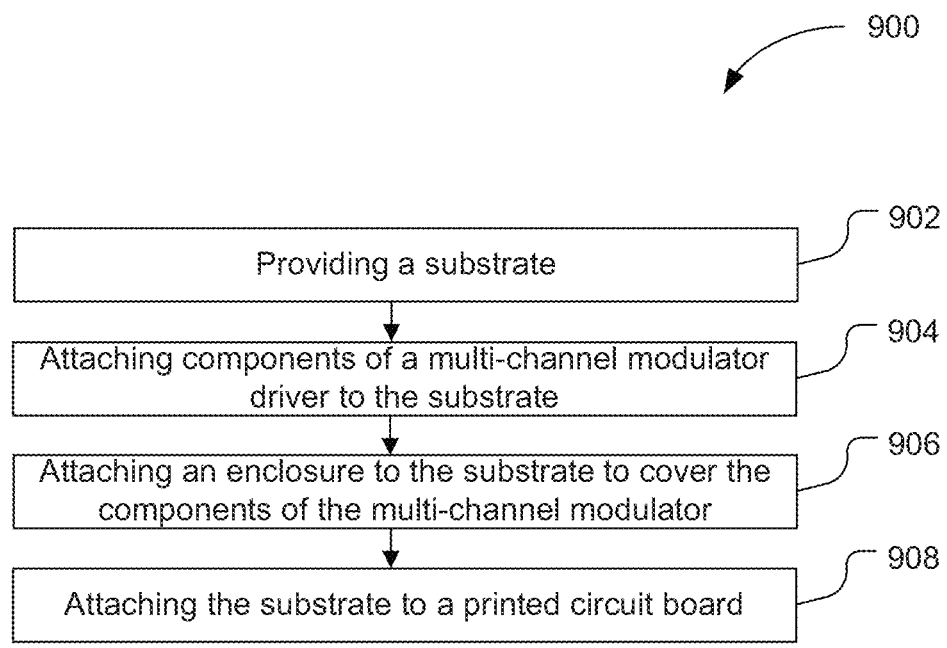
FIG. 9 is a flow diagram of a method for fabricating a system described herein, according to various embodiments.

FIG. 9 is a flow diagram of a method 900 for fabricating a system (e.g., system 100 of FIG. 1) described herein, according to various embodiments. At 902, the method 900 may include providing a substrate. The substrate may comport with embodiments described in connection with substrate 108 of FIG. 1.

At 904, the method 900 may further include attaching components (e.g., components 104, 106 of FIG. 1) of a multi-channel modulator driver to the substrate. For example, the components may be mounted on the substrate using a solder surface mount technique or any other suitable process. The components may include, first components (e.g., components 104) associated with a first channel and second components (e.g., components 106) associated with a second channel.

At 906, the method 900 may further include attaching an enclosure (e.g., enclosure 102 of FIG. 1) to the substrate to cover the components of the multi-channel modulator. The enclosure may have at least one wall (e.g., wall 110 of FIG. 1) that extends from the enclosure to the substrate and may be disposed between the first components and the second components. In some embodiments, a peripheral region of the enclosure may be attached to the substrate using an electrically insulative adhesive and the wall may be attached to the substrate using an electrically conductive adhesive. The wall may be attached to a ground structure (e.g., ground strip 126 of FIG. 1) formed on the substrate. In some embodiments, the enclosure may be prepared for attachment by exposing the enclosure to heat (e.g., baking in nitrogen environment for about 4 hours at 100° C.) to drive out any moisture in the enclosure.

At 908, the method 900 may further include attaching the substrate to a printed circuit board (e.g., printed circuit board 120 of FIG. 1). For example, in some embodiments, the substrate may be mounted on the printed circuit board using a solder reflow process or any other suitable process. The substrate may include an epoxy material and the enclosure may be fabricated using an electrically conductive polymer that may resist softening under temperature conditions associated with the solder reflow process or other mounting process. In some embodiments, the temperature conditions associated with the solder reflow process may include a peak temperature of about 260° C.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. A method, comprising:

providing a substrate;

attaching components of a multi-channel modulator driver to the substrate, the components including at least first components associated with a first channel and second components associated with a second channel; and attaching an enclosure to the substrate to cover the multi-channel modulator driver, wherein:
   the enclosure has a wall and a top region coupled with the wall;
   the wall is disposed between the first components and the second components;
   the enclosure and the wall are composed of an electrically conductive polymer; and
   the wall includes a first portion that has the electrically conductive polymer covered by a film and a second portion that has the electrically conductive polymer not covered by the film, wherein the film includes at least one metal.

2. The method of claim 1, wherein:
the components are attached using a solder surface mount technique; and
the components are configured to emit radio frequency (RF) energy.

3. The method of claim 1, wherein:
the substrate includes a ground structure disposed between the first components and the second components of the multi-channel modulator driver; and
attaching the enclosure to the substrate includes attaching a peripheral region of the enclosure to the substrate using an adhesive and attaching the wall to the ground structure using an electrically conductive adhesive to couple the film to the ground structure.

4. The method of claim 3, further comprising:
mounting the substrate on a printed circuit board using a solder reflow process, wherein the substrate comprises an epoxy material and wherein the electrically conductive polymer has a surface resistivity ranging from 10 Ohms to 5000 Ohms and resists softening under temperature conditions associated with the solder reflow process.

* * * * *